United States Patent
Harshe et al.

(10) Patent No.: US 12,055,595 B2
(45) Date of Patent: Aug. 6, 2024

(54) METHOD AND SYSTEM FOR ESTIMATING AN END OF LIFE OF A RECHARGEABLE ENERGY STORAGE DEVICE

(71) Applicant: Cummins Inc., Columbus, IN (US)

(72) Inventors: Omkar A. Harshe, Columbus, IN (US); Kameshwaran Sasidharan, Indianapolis, IN (US); John P O'Brien, Columbus, IN (US)

(73) Assignee: CUMMINS INC., Columbus, IN (US)

( * ) Notice: Subject to any disclaimer, the term of this patent is extended or adjusted under 35 U.S.C. 154(b) by 297 days.

(21) Appl. No.: 17/614,130

(22) PCT Filed: May 29, 2020

(86) PCT No.: PCT/US2020/035180
§ 371 (c)(1),
(2) Date: Nov. 24, 2021

(87) PCT Pub. No.: WO2020/243466
PCT Pub. Date: Dec. 3, 2020

(65) Prior Publication Data
US 2022/0221523 A1     Jul. 14, 2022

Related U.S. Application Data

(60) Provisional application No. 62/854,699, filed on May 30, 2019.

(51) Int. Cl.
*G01R 31/392* (2019.01)
*B60L 58/16* (2019.01)
*G01R 31/367* (2019.01)

(52) U.S. Cl.
CPC ............ *G01R 31/392* (2019.01); *B60L 58/16* (2019.02); *G01R 31/367* (2019.01); *B60L 2240/547* (2013.01); *B60L 2250/16* (2013.01)

(58) Field of Classification Search
CPC ..... G01R 31/392; G01R 31/367; B60L 58/16; B60L 2240/547; B60L 2250/16;
(Continued)

(56) References Cited

U.S. PATENT DOCUMENTS 6,545,448 B1   4/2003   Stanley
7,730,984 B2   6/2010   Heap
(Continued)

FOREIGN PATENT DOCUMENTS

WO   2017157245 A1   9/2017

OTHER PUBLICATIONS

International Search Report and Written Opinion for International patent application No. PCT/US2020/035180, filed May 29, 2020, mailed Aug. 26, 2020.
(Continued)

*Primary Examiner* — Tyler J Lee
*Assistant Examiner* — Yufeng Zhang
(74) *Attorney, Agent, or Firm* — Faegre Drinker Biddle & Reath LLP

(57) ABSTRACT

Methods and systems of estimating an end of life of a rechargeable energy storage device in an energy storage system is disclosed. The system includes at least a motor, the energy storage device associated with the motor, a processing unit associated with the energy storage device, and at least one sensor operatively coupled with the processing unit and the energy storage device. The method includes measuring a most recent state of health (SOH) of the energy storage device after the system is started, storing the most recent SOH with at least one previously measured SOH, calculating a new replace-by date of the energy storage device based on the most recent SOH and the at least one previously measured SOH, and replacing a previously calculated old replace-by date with the new replace-by date, the
(Continued)

new replace-by date being the same as or shorter than the old replace-by date.

19 Claims, 5 Drawing Sheets

(58) Field of Classification Search
CPC .. B60L 2240/549; B60L 2260/52; B60L 3/12; B60L 53/80
See application file for complete search history.

(56) References Cited

U.S. PATENT DOCUMENTS

| | | | |
|---|---|---|---|
| 8,332,342 B1 | 12/2012 | Saha | |
| 8,407,018 B2 | 3/2013 | White | |
| 9,229,063 B2 | 1/2016 | Humia | |
| 9,588,187 B2 | 3/2017 | Park | |
| 9,709,632 B2 | 7/2017 | Miyaki | |
| 9,846,199 B2 | 12/2017 | Vian | |
| 10,011,187 B2 | 7/2018 | Cha | |
| 10,101,406 B2 | 10/2018 | Park | |
| 2006/0028172 A1 | 2/2006 | Vaillancourt | |
| 2007/0222418 A1 | 9/2007 | Le Gall | |
| 2009/0027056 A1 | 1/2009 | Huang | |
| 2010/0250162 A1 | 9/2010 | White | |
| 2012/0283902 A1 | 11/2012 | Kusumi et al. | |
| 2018/0143257 A1 | 3/2018 | Humberto | |
| 2018/0102002 A1* | 4/2018 | Ohta | B60L 15/20 |
| 2019/0213803 A1* | 7/2019 | Ye | H04L 67/131 |

OTHER PUBLICATIONS

International Preliminary Report on Patentability received for PCT Patent Application No. PCT/US2020/035180, mailed on Dec. 9, 2021, 8 pages.

* cited by examiner

METHOD AND SYSTEM FOR ESTIMATING AN END OF LIFE OF A RECHARGEABLE ENERGY STORAGE DEVICE

CROSS-REFERENCE TO RELATED APPLICATIONS

This application is a national phase application of International Application No. PCT/US2020/035180, filed on May 29, 2020, which claims priority to U.S. Provisional Application No. 62/854,699, filed on May 30, 2019, each of which is incorporated herein by reference in its entirety.

FIELD OF THE DISCLOSURE

The present disclosure relates generally to energy storage devices, especially to estimating an end of life of energy storage devices such as rechargeable batteries.

BACKGROUND OF THE DISCLOSURE

Recently, there has been an increased demand for electric vehicles which do not use fuel and therefore do not expel harmful emissions as they operate, allowing for electric vehicles to be a greener, more environmentally friendly alternative to the traditional vehicles with fuel-powered engines. Electric vehicles use rechargeable energy storage devices, e.g. batteries, which provide the electric power, and the electric motors then convert the electric power into mechanical power, thereby moving the vehicle. Users of electric vehicles also can enjoy an almost instantaneous torque provided by the electric motors, compared to the torque of internal combustion engines which increases in tandem with the engine's rate of revolutions per minute (RPM). Therefore, electric vehicles have better response than fuel-powered engines, and this has added to the increase in their popularity in recent years.

Because the batteries will eventually wear out and need to be replaced, the users must understand when the batteries will expire. However, the duration of the life of batteries may vary greatly depending on how the users drive their vehicles. Even if there is a predetermined replace-by date as set by the manufacturer of the batteries when they are sold, a user who drives constantly for a longer distance on vacation trips, for example, may wear out the batteries faster than another who only drives the vehicle within the boundaries of the town or city where he or she lives. As such, when the latter user replaces the batteries on the predetermined replace-by date, the user may be replacing batteries that still have a few more months of battery life left in them before they actually need replacement. Furthermore, different electric vehicles use different types of batteries, so even if the user brings in the batteries for replacement, the manufacturer may be out of stock of batteries compatible with the user's vehicle. To prevent this from happening, the user would first need to inform the manufacturer weeks or months in advance to make sure the manufacturer has the compatible replacement batteries in stock when the user needs to replace the batteries, which would incur burden on the users.

Therefore, there is a need for an accurate and effective method to estimate the end of life of rechargeable batteries.

SUMMARY OF THE DISCLOSURE

Various embodiments of the present disclosure relate to methods and systems to estimating an end of life of a rechargeable energy storage device in an energy storage system are disclosed herein. The energy storage system has at least a motor, the energy storage device associated with the motor, a processing unit associated with the energy storage device, and at least one sensor operatively coupled with the processing unit and the energy storage device. In one embodiment, the sensors measure a most recent state of health (SOH) of the energy storage device after the system is started. The processing unit stores the most recent SOH with at least one previously measured SOH, calculates a new replace-by date of the energy storage device based on the most recent SOH and the at least one previously measured SOH, and replaces a previously calculated old replace-by date with the new replace-by date, the new replace-by date being the same as or shorter than the old replace-by date.

In one aspect of the embodiment, the new replace-by date is calculated based on the most recent SOH and the at least one previously measured SOH measured during a past predetermined period of time. In yet another aspect, the predetermined period of time is between 3 to 12 months prior to the most recent SOH. In another aspect, among the at least one previously measured SOH, a more recent measurement has greater weight in calculating the new replace-by date than an older measurement.

In one embodiment, the processing unit replaces an average SOH from all SOH measurements performed on a same day as the most recent SOH. In another embodiment, the processing unit calculates the new replace-by date by applying a curve fitting algorithm to the most recent SOH and the at least one previously measured SOH to obtain an estimate function, and extrapolating the new replace-by date based on the estimate function. In one aspect of this embodiment, the estimate function is a linear function whereas in another aspect of this embodiment, the estimate function is a non-linear function.

In one embodiment, the replace-by date is defined as a date when the most recent SOH is expected to reach a predetermined final SOH value of the energy storage device. In one aspect of this embodiment, the predetermined final SOH value is 70% of an initial SOH of the energy storage device.

In some examples, the energy storage system is implemented in a vehicle. In one embodiment, estimating the end of life of the rechargeable energy storage device further includes determining a travel range of the vehicle based on the most recent SOH. In one aspect of this embodiment, the travel range is further determined based on an average energy consumption of the vehicle. In another aspect of the embodiment, a display associated with the vehicle displays the travel range and the new replace-by date.

In yet another aspect of the embodiment, the processing unit communicates, via wireless communication, a notification to a supplier of the energy storage device to coordinate a preorder of a replacement rechargeable energy storage device before the new replace-by date. In yet another embodiment, the most recent SOH and the at least one previously measured SOH are stored in a cloud-based data storage system.

Also disclosed in the present disclosure is an energy storage system including a rechargeable energy storage device and a motor associated with the energy storage device. The energy storage system includes at least one sensor operatively coupled with the energy storage device, where the at least one sensor measures a most recent state of health (SOH) of the energy storage device after the energy storage system is started. The energy storage system also includes a processing unit associated with the energy storage device and operative coupled with the at least one sensor.

The processing unit can calculate a new replace-by date of the energy storage device based on the most recent SOH and the at least one previously measured SOH, and replace a previously calculated old replace-by date with the new replace-by date, the new replace-by date being the same as or shorter than the old replace-by date.

Also disclosed in the present disclosure is a vehicle including a motor, an energy storage device associated with the motor, and a processing unit associated with the energy storage device. The vehicle also includes at least one sensor operatively coupled with the processing unit and the energy storage device, the sensors operative to measure a most recent state of health (SOH) of the energy storage device after the vehicle is started. The processing unit is operative to store the most recent SOH with at least one previously measured SOH, calculate a new replace-by date of the energy storage device based on the most recent SOH and the at least one previously measured SOH, and replace a previously calculated old replace-by date with the new replace-by date, the new replace-by date being the same as or shorter than the old replace-by date.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

The embodiments will be more readily understood in view of the following description when accompanied by the below figures and wherein like reference numerals represent like elements. These depicted embodiments are to be understood as illustrative of the disclosure and not as limiting in any way.

Figure 1:
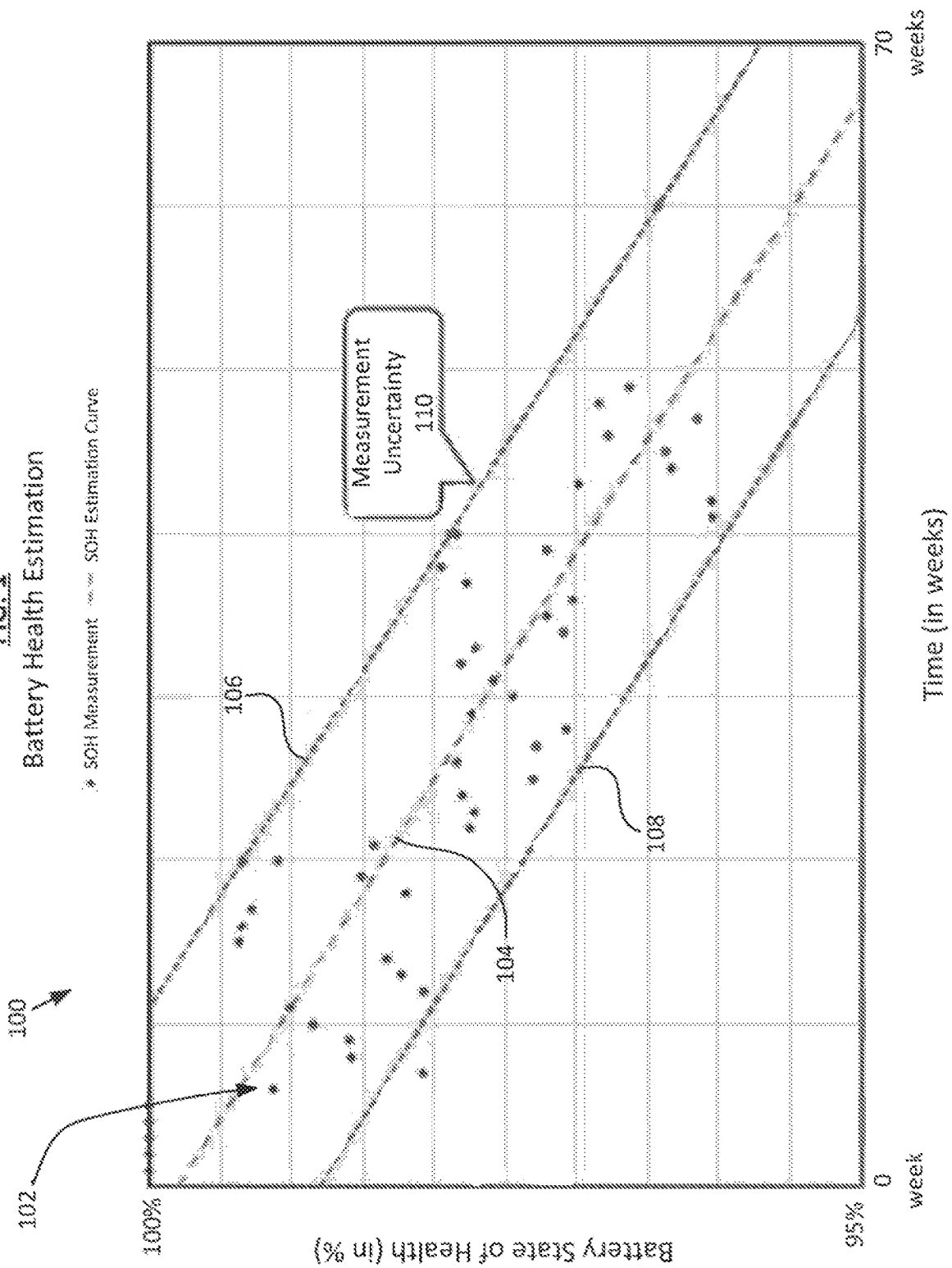
FIG. 1 is a graph of battery health measurements made during different times, a state of health (SOH) estimation curve fitted based on the plotted SOH measurements, and deviation of the measurements from the fitted SOH curve.

While the present disclosure is amenable to various modifications and alternative forms, specific embodiments have been shown by way of example in the drawings and are described in detail below. The intention, however, is not to limit the present disclosure to the particular embodiments described. On the contrary, the present disclosure is intended to cover all modifications, equivalents, and alternatives falling within the scope of the present disclosure as defined by the appended claims.

DETAILED DESCRIPTION OF THE DISCLOSURE

In the following detailed description, reference is made to the accompanying drawings which form a part hereof, and in which is shown by way of illustration specific embodiments in which the present disclosure is practiced. These embodiments are described in sufficient detail to enable those skilled in the art to practice the present disclosure, and it is to be understood that other embodiments can be utilized and that structural changes can be made without departing from the scope of the present disclosure. Therefore, the following detailed description is not to be taken in a limiting sense, and the scope of the present disclosure is defined by the appended claims and their equivalents.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments. Furthermore, the described features, structures, or characteristics of the subject matter described herein may be combined in any suitable manner in one or more embodiments.

FIG. 1 shows a battery health estimation graph 100 which depicts an example of how the health of an energy storage device may deteriorate over many weeks of use. The energy storage device as referred to herein may be rechargeable lithium-ion batteries, fuel cells, lithium-sulfur batteries, capacitors or supercapacitors, redox flow batteries, aluminum-graphite batteries, bioelectrochemical batteries, solar panels, solid state batteries, superconducting magnetic energy storage such as superconducting storage coils, as well as any other suitable types of energy storage as known in the art. In any of these energy storages devices, the amount of energy that can be obtained decreases as the energy storage device continues to be used. In some examples, the energy storage device may be used to power a vehicle, a building, a power grid, a computer, or any other suitable types of electrical device(s). It should be noted that although some of the figures and examples herein may refer to electric vehicles as an example of a vehicle which the energy storage device may be used, it should be understood that the energy storage device may also be used in hybrid vehicles which not only include electric motors but also engines run by fuels such as gasoline, diesel, etc., as appropriate.

In the graph 100, black dots represent a state of health (SOH) measurement 102 taken during a certain week. In one week, one SOH measurement 102 is recorded. In one example, if there are multiple measurements available on a given day, an average or median of the measurements is calculated and considered as the SOH for the day. In one example, an average or median of the measurements taken during a specified week is used as the SOH measurement 102 to be considered in estimating the SOH of the energy storage device. In one example, only the average or median of all the measurements performed on the same day, or within a 24-hour time span, is recorded and used for the SOH estimation calculation. In one example, only the lowest measurement made during the week is considered in estimating the SOH of the energy storage device. A broken line 104 in the graph represents an SOH estimation curve that is obtained using the SOH measurements. Two additional broken lines 106 and 108 above and below the SOH estimation curve 104 represent the acceptable deviation of the measured data from the measurement uncertainties. The top line 106 represents an upper deviation curve, while the bottom line 108 represents a lower deviation curve. Any SOH measurement 102 outside the defined deviation is disregarded as it could be an indication of measurement error rather than a true measurement. The area bounded by the upper and lower deviation curves 106, 108 represents measurement uncertainty 110. FIG. 1 shows a generally downward sloping trend in the measurement data, but some data shows the SOH measurement values increase from one week to the next, which may be caused by different factors.

It should be understood that SOH is different from a state of charge (SOC). While the SOC measures the current charge level of the battery, such as a current battery capacity as compared to the maximum battery capacity at the time, the SOH measures the current state of battery life. Because as the battery is continually used, its capacity will steadily decrease, so even while the SOC is measured to be 100% of the current battery capacity, the capacity itself would be lower than what it used to be months ago. The 100% battery capacity measured now and the 100% battery capacity measured months ago would hold different amounts of charge. For example, after the battery is used for an extended period of time, the 100% SOC measured now may only hold as much as 90% SOC measured when the battery was initially installed. As such, in this example, the SOH can be said to have decreased from 100% SOH to 90% SOH during this time period. The SOH of the battery can be monitored using voltage measurements, for example via cyclic voltammetry, differential voltage method, and incremental capacity analysis (ICA), to name a few. Other suitable methods for measuring the SOH of the battery may be employed as known in the art.

Figure 2:
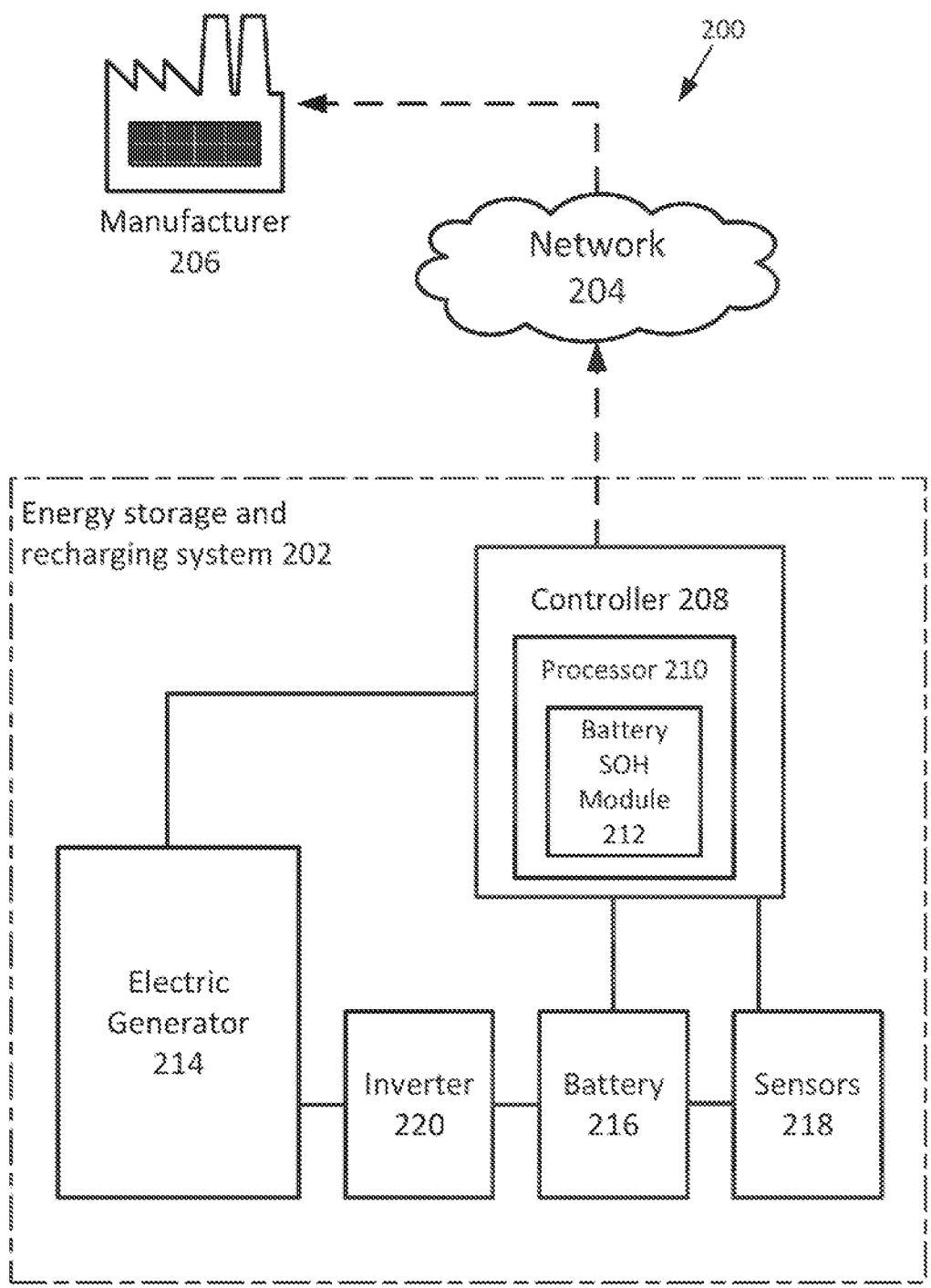
FIG. 2 is a schematic diagram showing a system used to estimate the end of life of a battery and to communicate the end of life to the manufacturer for a replacement battery.

FIG. 2 shows a schematic diagram of a network system 200 according to one embodiment. The system 200 includes an energy storage and recharging system 202, a network 204, and a manufacturer 206 or provider of the energy storage device used in the energy storage and recharging system 202. The energy storage and recharging system 202 includes a controller 208 which houses a processor 210. The processor 210 has a battery SOH module 212 which performs the calculations based on the measurements obtained. The controller 208 is connected to an electric generator 214 which converts mechanical energy to electrical energy to be stored in an energy storage device, such as the battery 216. For example, mechanical energy may be provided from an engine that is mechanically coupled to the electric generator 214, the engine being fuel-powered such that the mechanical energy from the engine assists in powering the generator 214. The engine, in some examples, may belong to a vehicle such as a hybrid vehicle. The processor 210 also has a memory unit (not shown) such as read only memory to store the instructions to be used by the battery SOH module 212 to perform the estimation calculations as well as random access memory to store previously calculated data so that the battery SOH module 212 can use the previously calculated data for future calculations. The processor 210 can be a central processing unit, system on a chip, or other types of suitable processing units known in the art. In some examples, the generator 214 and the inverter 220 may be absent from the energy storage and recharging system 202. In such case, the energy storage device, e.g. the battery 216, may receive electrical energy directly from a power grid, another energy storage device, or any other suitable energy source.

The energy storage and recharging system 202 also includes an energy storage device, e.g. a rechargeable battery 216, and sensors 218 coupled to the battery 216. The sensors 218 may be physical or virtual sensors which perform the necessary measurements of the battery 216 and send the measurement data to the controller 208, or more specifically to the processor 210, for the battery SOH module 212 to calculate a predicted end of life for the battery 216. For example, the sensors 218 may be voltage sensors, capacitance sensors, current sensors, etc. The battery 216 and the generator 214 are connected via an inverter 220 which converts electricity from a direct current (DC) source, i.e. the battery 216, into alternating current (AC) to activate the generator 214. In some examples, the generator 214 is a motor-generator that is mechanically coupled to an axle connected to wheels of a vehicle, if the energy storage and recharging system 202 is implemented in the vehicle such as a hybrid or electric vehicle. In one example, the motor-generator 214 may be mechanically coupled to another axle connected to additional wheels.

In the figure, the broken lines connecting the network 204, manufacturer 206, and controller 208 represent a wireless data communication network. For example, the controller 208 has a wireless communication module (not shown) to connect to the network 204 via Wi-Fi, cellular network (such 3G, 4G, or LTE), Bluetooth, Infrared, or any other suitable wireless communication methods known in the art. The network 204 then sends the calculated end of life data of the battery to the manufacturer 206 so a replacement battery can be prepared for installation. In turn, the manufacturer 206 can then notify the user when the end of life of the battery approaches. In another example, the battery SOH module 212 may be located within a cloud-based network 204 such that the controller 208 does not perform the calculation but instead sends the measured sensor data to the cloud-based network 204. A remote processing unit connected to the network 204 can perform the calculations, and then send the results of the calculation back to the controller 208 and/or to the manufacturer 206, as appropriate.

Figure 3:
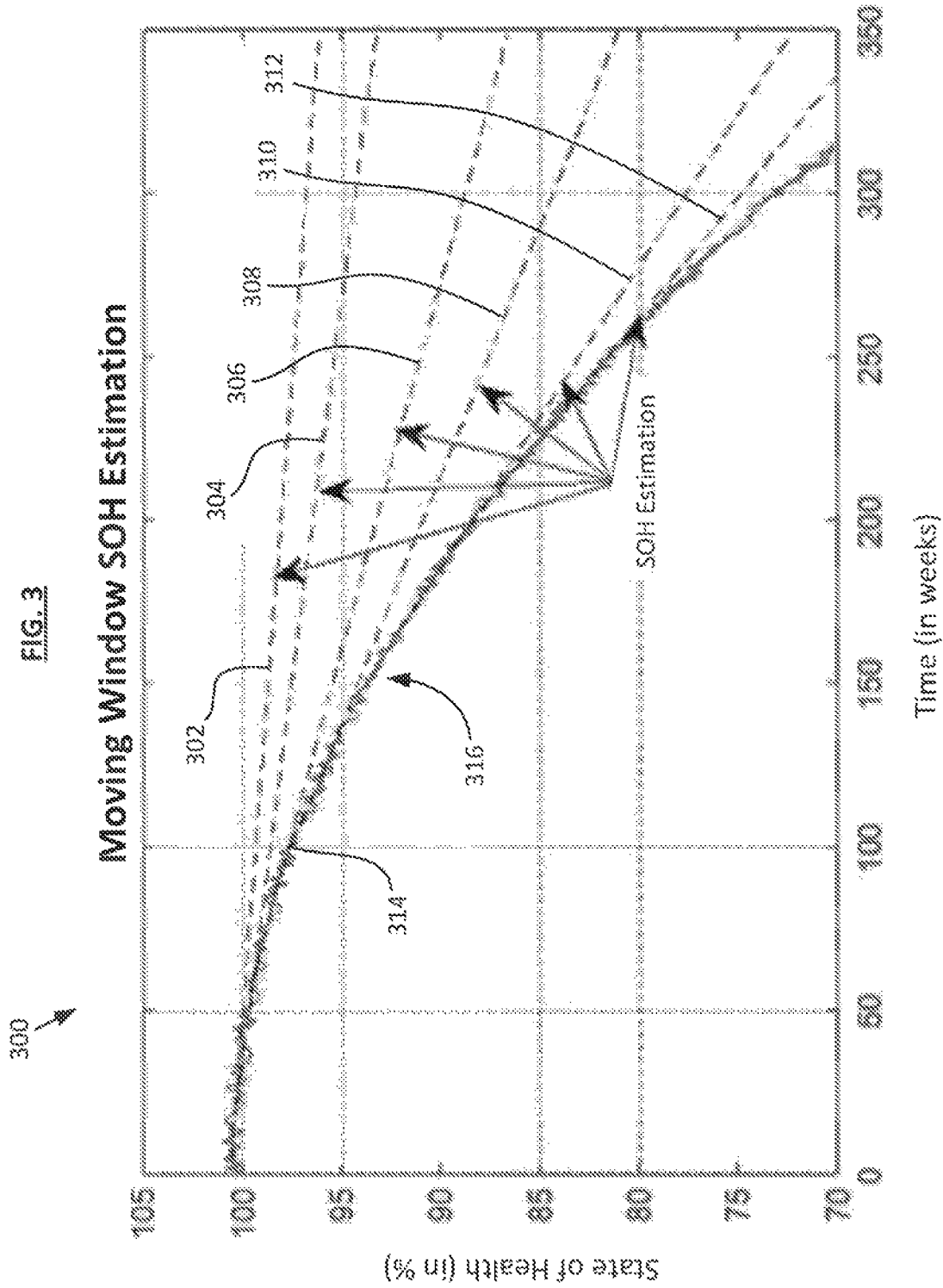
FIG. 3 is a graph of battery health measurements made during an extended period of time and a number of SOH estimation curves drawn based on estimations calculated at different times during the extended period of measurement.

FIG. 3 shows a graph of moving window SOH estimation 300 according to one embodiment, where the SOH estimation is adjusted depending on the newest estimation obtained as more measurement data is made available. For example, a first SOH estimation curve 302 is obtained initially, when the battery SOH module 212 performs the first calculation of battery end of life based on the data provided by the sensors 218. Using the first SOH estimation curve 302, the SOH at the end of 350 weeks after the battery is installed would be approximately 96%. However, weeks later, a second SOH estimation curve 304 is calculated, which lowers the estimated SOH at the end of 350 weeks to about 93%. This lowering of estimated end of life indicates that it would take a shorter period of time for the battery to meet its end of life. Later on, a third SOH estimation curve 306, a fourth SOH estimation curve 308, a fifth SOH estimation curve 310, and a sixth SOH estimation curve 312, etc., are then calculated, with each new curve lowering the SOH at the end of 350 weeks more than the prior curve. A plot of the actual SOH measurement data used 314 shows that there are fluctuations between measurement data taken on different days, but the plot 314 follows an overall SOH estimation curve 316. The overall SOH estimation curve 316 is the final estimation curve calculated when the battery reaches its end of life, so this curve 316 is based entirely on prior measurements and therefore the most "accurate" estimation curve.

Figure 4:
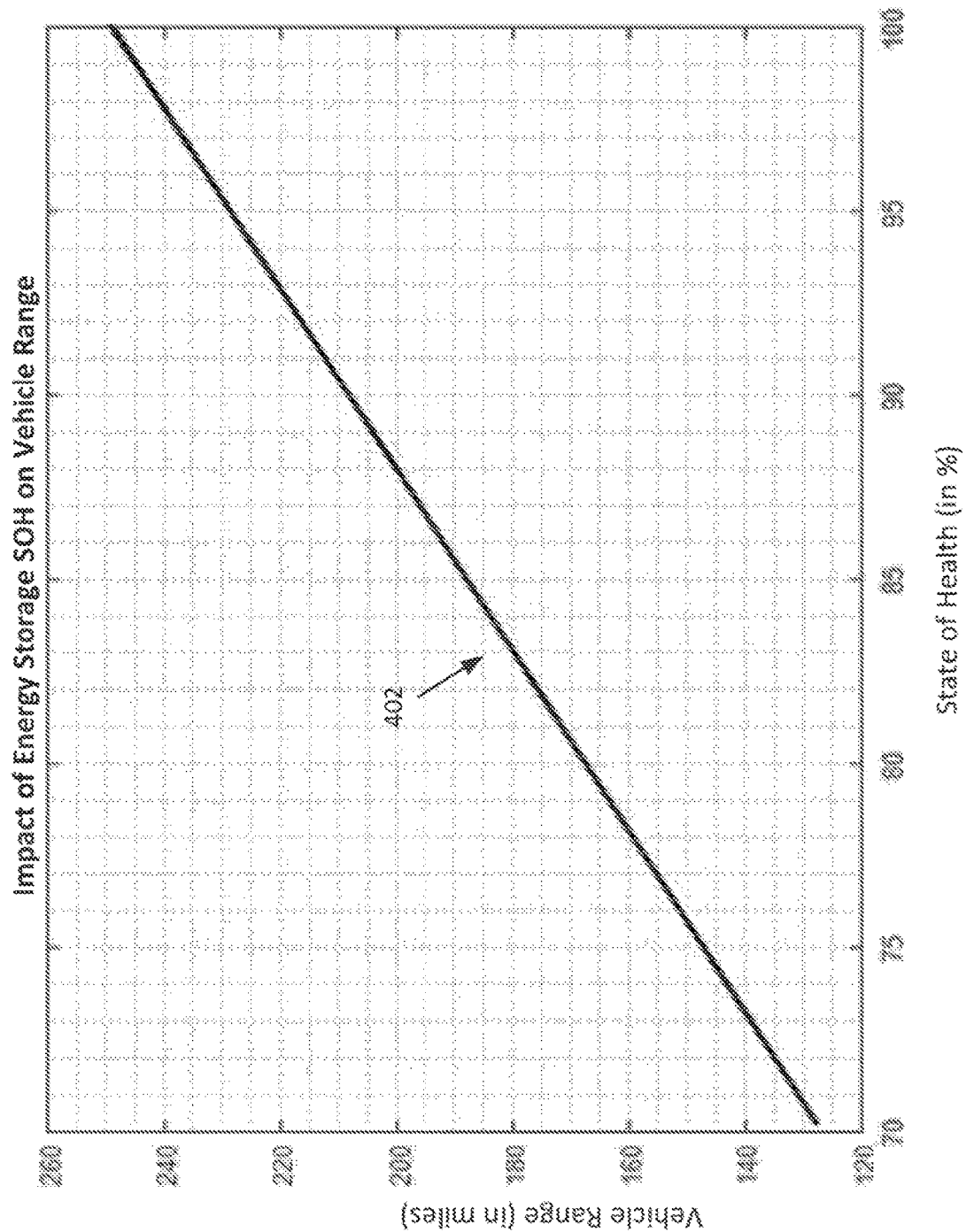
FIG. 4 is a graph showing an impact of energy storage state of health on vehicle distance range.

FIG. 4 shows a graph 400 depicting the impact of energy storage SOH on vehicle distance range, i.e. how far an electric or hybrid vehicle can travel with each full charge, when the energy storage system is implemented in the vehicle. The graph 400 can be obtained using a linear estimate function as further explained below in FIGS. 5 and 6. As seen by the plot 402 defining the relationship between the SOH and the vehicle range, the vehicle range is directly proportional to the SOH percentage, therefore a user of the vehicle should replace the energy storage when the SOH is below a certain threshold. In one example, the threshold is 70% SOH, because the vehicle range is now approximately one half the original range when the SOH was 100%. In another example, the threshold can be higher, such as 75%, 80%, 85%, or 90% SOH, or lower, such as 65%, 60%, 55%, or 50% SOH, for example, depending on the battery chemistry. Some manufacturers do not recommend using the battery when the SOH is too low due to deterioration in performance and other safety reasons, while some manufacturers may recommend using the battery for as long as possible to reduce environmental waste. Embodiments in the present disclosure accommodate for various levels of threshold.

The date when the SOH is estimated to reach this threshold is called an end of life date or a replace-by date. Using the graph 400, it is possible to predict how far the vehicle can travel when the most recent SOH is known. For example, the user may predict that the travel range may be a little more than 200 miles when the energy storage is fully charged, and the most recent SOH measurement indicates 90%. Being able to predict how far the vehicle can travel allows the user to better coordinate his or her travel to prevent the unfavorable situation where the vehicle runs out of power and there is no charge station nearby.

Furthermore, average energy consumption can be taken into calculation of the available vehicle range. For example, the vehicle records how much energy was consumed each hour or each day over a period of time and find the average energy consumption. The vehicle also records the distance traveled during that time, and determines, based on prior measurement of the energy consumption and distance traveled, the vehicle range that can be traveled based on the current SOH measurement.

Figure 5:
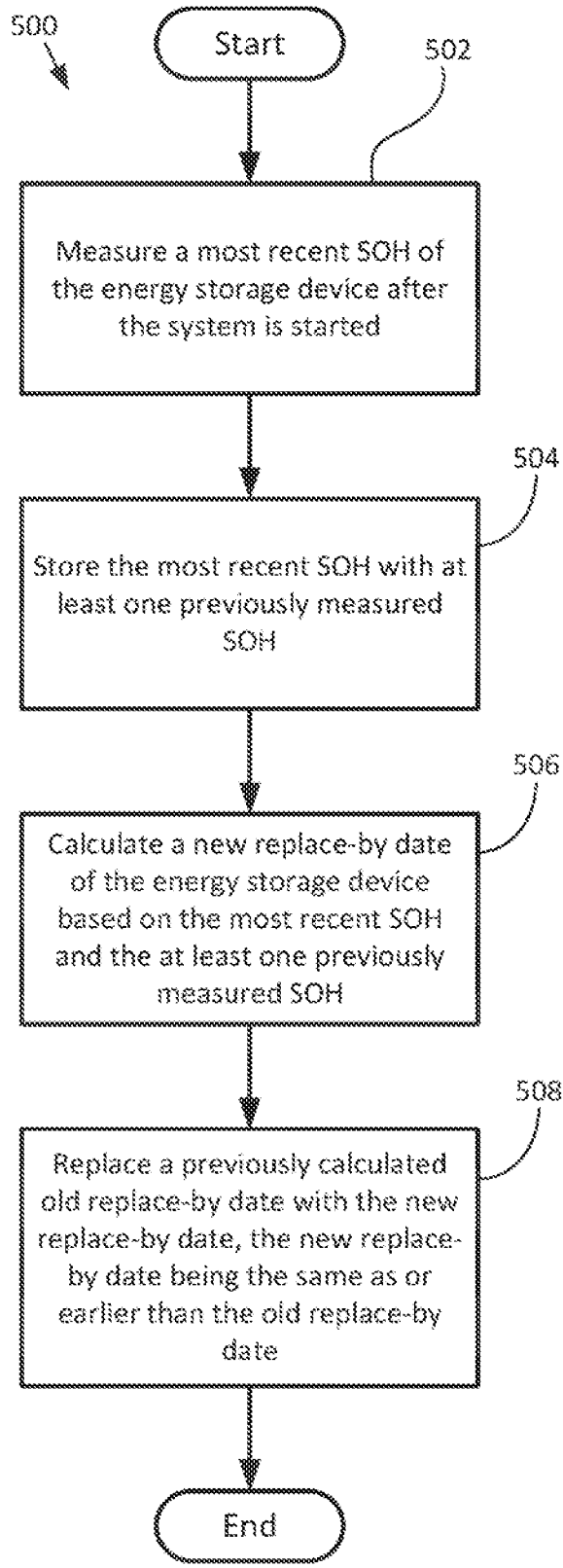
FIG. 5 is a flow diagram showing a method of estimating end of life of a battery as disclosed herein.

FIG. 5 shows a method of replace-by date estimation 500 according to one embodiment. In the method shown, a first step 502 is to measure a most recent SOH of the energy storage device after the energy storage and recharging system is started, or powered on. In another example, the most recent SOH can be measured after the energy storage device is fully charged, after the energy storage device is used for a certain period of time, or after the energy storage device releases a predetermined amount of power, depending on the manufacturer's recommendation of the most appropriate time to measure the SOH value of the energy storage device. In the next step 504, the most recent SOH is stored with at least one previously measured SOH. The SOH measurements can be stored in a memory unit associated with the processor operatively coupled with the energy storage and recharging system or located within a cloud-based network as explained above. Then, in step 506, a new replace-by date of the energy storage device is calculated based on the most recent SOH and the at least one previously measured SOH. As such, the new replace-by date is calculated from a history of SOH measurements. Furthermore, in one example, the initial replace-by date may be set to a certain number of years, such as 10 years after the battery is manufactured.

In one example, the new date is calculated only after reaching a threshold number of SOH measurements obtained, such that there is a sufficient sample size to perform the calculations. For example, a window size can be set so that the replacement date is calculated once there are enough samples to fill the window size. In one example, the window size can be as short as 3 months, i.e. the calculation begins when 3 months' worth of SOH measurement data is obtained. In another example, the window size can be as long as 12 months. Also, the calculation is based solely on the SOH measurements made during this window size. Therefore, if the window size is 3 months, SOH measurements performed 4 months ago would not be considered in calculating the most up-to-date replace-by date. This is to prevent stale data from affecting the newest calculation and to ensure that enough data is available to make a reliable estimation. An estimation will also not be performed if enough measurements are not available for the selected window. In one example, if the window size is set to 3 months, and data is available for only 1 month, then the end of life calculation will wait until enough data is available before generating a new replace-by date.

In step 508, a previously calculated old replace-by date is replaced with the new replace-by date, where the new replace-by date is the same as before or earlier than the old replace-by date. For example, if the older date is Oct. 31, 2025, the newer date is on Oct. 31, 2025 or earlier. For any energy storage device, the lifespan of the device cannot be extended without replacing its components, so after the energy storage device is installed, for example in the electric vehicle, the lifespan can only shorten each time the device is used. Ideally, all SOH measurements should reflect the trend that each new measurement has a lower SOH than the one before, but due to measurement uncertainties in one or more measurements such cell internal resistance, charge acceptance, and discharge capability, the actual measurements can indicate an increase in SOH as compared to a prior measurement. For example, if the window size is small and the energy storage device has a long lifespan, the small window size may only capture small fluctuations (e.g. noise) in the SOH measurements without necessarily reflecting the trend as a whole, so estimations performed using the limited number of measurements may result in a new replace-by date to be later than the old replace-by date. Having the new replace-by date replace the old replace-by date only if the new date is the same as or earlier than the old date reduces the likelihood of entering a date that is inaccurate by converging the prediction in a predictable manner.

In another example, the processor can decide to extend the window size (for example, from 3 months to 6 months) if the calculated new replace-by date is later than the old replace-by date to improve the accuracy of the performed estimation. In another example, when calculating the new replace-by date using numerous measurements including current and previously performed measurements, the newer, more recent measurements have greater weight than the older measurements. For example, within the window size, a new measurement performed during the past few days may be a better indicator for the SOH than an old measurement performed months ago. Therefore, different measurements can have different weights depending on the time they were performed.

Figure 6:
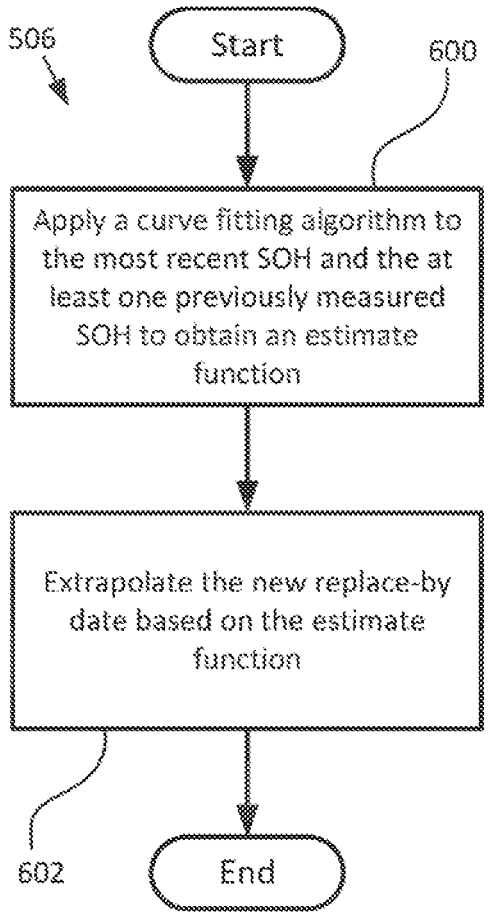
FIG. 6 is a flow diagram showing a method of calculating a new replace-by date of the battery as disclosed herein.

FIG. 6 shows one method of performing step 506 according to one embodiment. In step 600, a curve fitting algorithm is applied to the most recent SOH and the at least one previously measured SOH to obtain an estimate function. Then, in step 602, the new replace-by date is extrapolated based on the estimate function. In one example, the curve fitting algorithm is a linear function, whereas in another example, the algorithm is a nonlinear function including but not limited to polynomial functions. The new replace-by date can be extrapolated by calculating the approximate date by which the estimate function reaches the threshold value for replacing the energy storage device.

The present subject matter may be embodied in other specific forms without departing from the scope of the present disclosure. The described embodiments are to be considered in all respects only as illustrative and not restrictive. Those skilled in the art will recognize that other implementations consistent with the disclosed embodiments are possible. The above detailed description and the examples described therein have been presented for the purposes of illustration and description only and not for limitation. For example, the operations described can be done in any suitable manner. The methods can be performed in any suitable order while still providing the described operation and results. It is therefore contemplated that the present embodiments cover any and all modifications, variations, or equivalents that fall within the scope of the basic underlying principles disclosed above and claimed herein. Furthermore, while the above description describes hardware in the form of a processor executing code, hardware in the form of a state machine, or dedicated logic capable of producing the same effect, other structures are also contemplated.

What is claimed is:

1. A method of estimating an end of life of a rechargeable energy storage device in an energy storage system of a vehicle comprising at least a motor, the rechargeable energy storage device associated with the motor, a processing unit associated with the rechargeable energy storage device, and at least one sensor operatively coupled with the processing unit and the rechargeable energy storage device, the method comprising:
    measuring, by the at least one sensor, a most recent state of health (SOH) of the rechargeable energy storage device after the energy storage system is started;
    storing, by the processing unit, the most recent SOH with a plurality of previously measured states of health including at least a newer previously measured SOH that was measured prior to the most recent SOH and an older previously measured SOH that was measured prior to the newer previously measured SOH;
    calculating, by the processing unit, a new replace-by date of the rechargeable energy storage device based on at least the most recent SOH, the newer previously measured SOH, and the older previously measured SOH;
    replacing, by the processing unit, a previously calculated old replace-by date with the new replace-by date, the new replace-by date being the same as or shorter than the previously calculated old replace-by date;
    calculating, by the processing unit, a travel range of the vehicle based on the most recent SOH; and
    displaying, on a display associated with the vehicle, the travel range of the vehicle and the new replace-by date of the rechargeable energy storage device.

2. The method of claim 1, wherein the newer previously measured SOH was measured during a first past predetermined period of time, and the older previously measured SOH was measured during a second past predetermined period of time, and each of the first and second past predetermined periods of time is between 3 to 12 months prior to the measuring of the most recent SOH.

3. The method of claim 1, further comprising replacing, by the processing unit, an average SOH from all SOH measurements performed on a same day as the most recent SOH.

4. The method of claim 1, wherein calculating the new replace-by date comprises:
    applying a curve fitting algorithm to the most recent SOH, the newer previously measured SOH, and the older previously measured SOH to obtain an estimate function; and
    extrapolating the new replace-by date based on the estimate function.

5. The method of claim 4, wherein the estimate function is a linear function or a nonlinear function.

6. The method of claim 1, wherein the replace-by date is defined as a date when the most recent SOH is expected to reach a predetermined final SOH value of the rechargeable energy storage device.

7. The method of claim 6, wherein the predetermined final SOH value is 70% of an initial SOH of the rechargeable energy storage device.

8. The method of claim 1, wherein the travel range is further determined based on an average energy consumption of the vehicle.

9. The method of claim 1, further comprising communicating, by the processing unit via wireless communication, a notification to a supplier of the rechargeable energy storage device to coordinate a preorder of a replacement rechargeable energy storage device before the new replace-by date.

10. The method of claim 1, wherein the most recent SOH and the plurality of previously measured states of health are stored in a cloud-based data storage system.

11. An energy storage system comprising:
    a rechargeable energy storage device;
    a motor associated with the rechargeable energy storage device;
    at least one sensor operatively coupled with the rechargeable energy storage device, the at least one sensor configured to measure a most recent state of health (SOH) of the rechargeable energy storage device after the energy storage system is started; and
    a processing unit associated with the rechargeable energy storage device and operative coupled with the at least one sensor, the processing unit configured to:
        calculate a new replace-by date of the rechargeable energy storage device based on at least the most recent SOH, a newer previously measured SOH that was measured prior to the most recent SOH, and an older previously measured SOH that was measured prior to the newer previously measured SOH, and
        replace a previously calculated old replace-by date with the new replace-by date, the new replace-by date being the same as or shorter than the previously calculated old replace-by date.

12. The system of claim 11, wherein the processing unit is configured to replace an average SOH from all SOH measurements performed on a same day as the most recent SOH.

13. The system of claim 11, wherein the processing unit is configured to calculate the new replace-by date by:
    applying a curve fitting algorithm to the most recent SOH, the newer previously measured SOH, and the older previously measured SOH to obtain an estimate function; and
    extrapolating the new replace-by date based on the estimate function.

14. A vehicle comprising:

a motor;

an energy storage device associated with the motor;

a processing unit associated with the energy storage device;

at least one sensor operatively coupled with the processing unit and the energy storage device, the at least one sensor operative to measure a most recent state of health (SOH) of the energy storage device after the vehicle is started, the processing unit operative to:

store the most recent SOH with a plurality of previously measured states of health including at least a newer previously measured SOH that was measured prior to the most recent SOH and an older previously measured SOH that was measured prior to the newer previously measured SOH;

calculate a new replace-by date of the energy storage device based on at least the most recent SOH, the newer previously measured SOH, and the older previously measured SOH; and replace a previously calculated old replace-by date with the new replace-by date, the new replace-by date being the same as or shorter than the previously calculated old replace-by date.

15. The method of claim 1, wherein each of at least the most recent SOH, the newer previously measured SOH, and the older previously measured SOH has a different weight such that the newer previously measured SOH has greater weight in calculating the new replace-by date than the older previously measured SOH.

16. The system of claim 11, wherein each of at least the most recent SOH, the newer previously measured SOH, and the older previously measured SOH has a different weight such that the newer previously measured SOH has greater weight in calculating the new replace-by date than the older previously measured SOH.

17. The system of claim 16, wherein the newer previously measured SOH was measured during a first past predetermined period of time, and the older previously measured SOH was measured during a second past predetermined period of time, and each of the first and second past predetermined periods of time is between 3 to 12 months prior to measuring the most recent SOH.

18. The vehicle of claim 14, wherein each of at least the most recent SOH, the newer previously measured SOH, and the older previously measured SOH has a different weight such that the newer previously measured SOH has greater weight in calculating the new replace-by date than the older previously measured SOH.

19. The vehicle of claim 18, wherein the newer previously measured SOH was measured during a first past predetermined period of time, and the older previously measured SOH was measured during a second past predetermined period of time, and each of the first and second past predetermined periods of time is between 3 to 12 months prior to measuring the most recent SOH.

\* \* \* \* \*